US008134870B2

(12) United States Patent
Alami et al.

(10) Patent No.: US 8,134,870 B2
(45) Date of Patent: Mar. 13, 2012

(54) HIGH-DENSITY NON-VOLATILE READ-ONLY MEMORY ARRAYS AND RELATED METHODS

(75) Inventors: Salwa B. Alami, Aix en Provence (FR); Lotfi B. Ammar, Gardanne (FR)

(73) Assignee: Atmel Corporation, San Jose, CA (US)

( * ) Notice: Subject to any disclaimer, the term of this patent is extended or adjusted under 35 U.S.C. 154(b) by 280 days.

(21) Appl. No.: 12/485,749

(22) Filed: Jun. 16, 2009

(65) Prior Publication Data

US 2010/0315856 A1    Dec. 16, 2010

(51) Int. Cl.
    *G11C 11/34*    (2006.01)
(52) U.S. Cl. .......... 365/185.05; 365/185.03; 365/185.12
(58) Field of Classification Search ............. 365/185.05, 365/185.03, 185.12
    See application file for complete search history.

(56) References Cited

U.S. PATENT DOCUMENTS

| | | | |
|---|---|---|---|
| 4,208,726 A | 6/1980 | McElroy | |
| 4,336,647 A | 6/1982 | McElroy | |
| 4,406,049 A | 9/1983 | Tam et al. | |
| 4,493,057 A | 1/1985 | McElroy | |
| 4,888,735 A | 12/1989 | Lee et al. | |
| 5,027,321 A | 6/1991 | Park | |
| 5,793,078 A | 8/1998 | Takeuchi | |
| 5,804,484 A | 9/1998 | Wen | |
| 5,811,337 A | 9/1998 | Wen | |
| 5,834,819 A | 11/1998 | Wen | |
| 5,917,224 A | 6/1999 | Zangara | |
| 6,137,720 A | 10/2000 | Lancaster | |
| 6,618,282 B1 * | 9/2003 | Poplevine et al. ............... 365/94 |
| 6,689,663 B1 | 2/2004 | Chang et al. | |
| 6,747,889 B2 | 6/2004 | Derner et al. | |
| 6,822,889 B2 | 11/2004 | Chen et al. | |
| 6,826,070 B2 | 11/2004 | Sung et al. | |
| 6,853,586 B2 | 2/2005 | Choy et al. | |

(Continued)

FOREIGN PATENT DOCUMENTS

EP    0601207 A1    6/1994

(Continued)

OTHER PUBLICATIONS

"U.S. Appl. No. 11/749,428, Jul. 18, 2008 Response to Restriction Requirement Mailed Jun. 18, 2008", 6 pgs.

(Continued)

*Primary Examiner* — Son Dinh
*Assistant Examiner* — Nam Nguyen
(74) *Attorney, Agent, or Firm* — Fish & Richardson P.C.

(57) ABSTRACT

In an embodiment, a read-only memory array includes a plurality of word lines, a plurality of bit-lines including first and second bit-lines, and a plurality of memory cells configured to represent data values. Each memory cell can include a transistor having a control terminal coupled to one of the plurality of word lines, a drain terminal, and a source terminal. Connections associated with the drain and source terminals of a particular memory cell can determine a data value represented by the memory cell. The memory cells of the plurality of memory cells that are coupled to less than two bit-lines are configured to represent one values.

19 Claims, 7 Drawing Sheets

U.S. PATENT DOCUMENTS

| | | |
|---|---|---|
| 6,875,659 B2 | 4/2005 | Yang et al. |
| 6,876,578 B2 * | 4/2005 | Shibata et al. ........... 365/185.03 |
| 6,885,600 B2 | 4/2005 | Tran et al. |
| 6,903,957 B2 | 6/2005 | Derner et al. |
| 6,914,819 B2 | 7/2005 | Yeh et al. |
| 6,956,779 B2 | 10/2005 | Tran |
| 6,975,539 B2 | 12/2005 | Tran |
| 7,002,827 B1 | 2/2006 | Sabharwal et al. |
| 7,009,880 B1 | 3/2006 | Liu |
| 7,120,063 B1 | 10/2006 | Liu et al. |
| 7,327,593 B2 | 2/2008 | Ostermayr et al. |
| 7,420,860 B2 | 9/2008 | Yamada et al. |
| 7,684,244 B2 | 3/2010 | Alami et al. |
| 2002/0015332 A1 | 2/2002 | Rolandi et al. |
| 2002/0190749 A1 | 12/2002 | Sun et al. |
| 2003/0023945 A1 | 1/2003 | Wnag et al. |
| 2003/0117845 A1 | 6/2003 | Yamauchi |
| 2004/0033670 A1 | 2/2004 | Yang et al. |
| 2004/0109356 A1 | 6/2004 | Choy et al. |
| 2004/0120193 A1 | 6/2004 | Nakaya et al. |
| 2005/0151205 A1 | 7/2005 | Taniguchi et al. |
| 2006/0239059 A1 | 10/2006 | Murata |
| 2008/0170430 A1 | 7/2008 | Miller et al. |
| 2008/0285326 A1 | 11/2008 | Alami et al. |

FOREIGN PATENT DOCUMENTS

| | | |
|---|---|---|
| EP | 1612806 A2 | 1/2006 |
| WO | WO-2006138742 A1 | 12/2006 |
| WO | WO-2008/143934 A1 | 11/2008 |

OTHER PUBLICATIONS

"U.S. Appl. No. 11/749,428, Non-Final Office Action Mailed on Oct. 16, 2008", 11 Pgs.

"U.S. Appl. No. 11/749,428, Restriction Requirement mailed Jun. 18, 2008", 7 pgs.

"U.S. Appl. No. 11/749,428, Response filed Feb. 17, 2009 to Non-Final Office Action mailed Oct. 16, 2008", 13 pages.

"U.S. Appl. No. 11/749,428, Non-Final Office Action mailed May 15, 2009", 10 Pgs.

"International Application Serial No. PCT/US2008/006235, International Search Report and Written Opinion mailed Aug. 29, 2008", p. 220, 13 pages.

"U.S. Appl. No. 11/749,428, Notice of Allowance mailed Nov. 2, 2009".

"U.S. Appl. No. 11/749,428, Response filed Aug. 14, 2009 to Non Final Office Action mailed May 15, 2009", 7 pgs.

* cited by examiner

HIGH-DENSITY NON-VOLATILE READ-ONLY MEMORY ARRAYS AND RELATED METHODS

CROSS-REFERENCE TO RELATED APPLICATION(S)

This application is related to co-pending, commonly assigned, U.S. patent application Ser. No. 11/749,428, filed on May 16, 2007, and entitled "HIGH DENSITY NON-VOLATILE MEMORY ARRAY," and published on Nov. 20, 2008, which application is incorporated herein by reference in its entirety.

FIELD OF THE DISCLOSURE

The present disclosure relates generally to high-density non-volatile read-only memory (ROM) arrays and, more particularly to, high-density non-volatile ROM arrays with reduced numbers of connections on the bit-lines.

BACKGROUND

High-density non-volatile memory arrays can be used to store digital data for computing systems, such as computers, mobile telephones, personal digital assistants, music players, other electronic devices, or any combination thereof. In an example, the memory arrays may include multiple transistor cells, where each transistor cell can include a floating gate adapted to retain an electrical charge representative of a data value when power is removed from the transistor cell. Bit-lines, word lines, and reference lines (i.e., wire traces, active/diffusion reference lines, other electrical interconnections, or any combination thereof, hereinafter generally referred to as "lines") may be used in various combinations to store data to and retrieve data from the transistor cells.

Unfortunately, as the size of the memory arrays has decreased and the transistor cell density has increased, routing of such lines has become increasingly complex. Further, such lines can contribute to undesired power consumption within a particular array and may adversely impact read margins. In particular, the wire traces may introduce undesired impedances, which can reduce sensed-voltage-level read margins, for example.

Additionally, the transistors within the array may contribute to overall power consumption. For example, charging and discharging of gate and interconnect capacitances can dissipate a significant amount of power. Further, parasitic leakage through the reverse bias P/N junctions and/or through sub-threshold source-to-drain currents of metal-oxide semiconductor (MOS) transistors in an "off" state can also dissipate power.

DETAILED DESCRIPTION

The following detailed description refers to the accompanying drawings that depict various details of examples selected to show how particular embodiments may be implemented. The discussion herein addresses various examples of the subject matter at least partially in reference to these drawings and describes the depicted embodiments in sufficient detail to enable those skilled in the art to practice the embodiments disclosed herein. Many other embodiments may be utilized for practicing the subject matter than the illustrative examples discussed herein, and many structural and operational changes, in addition to the alternatives specifically discussed herein, may be made without departing from the scope of the subject matter.

In this description, references to "one embodiment," "an embodiment," "one example," "an example," "a particular example," or any combination thereof mean that the feature being referred to is, or may be, included in at least one embodiment or example. Separate references to "an embodiment" or "one embodiment" or to "one example" or "an example" in this description are not intended to necessarily refer to the same embodiment or example; however, neither are such embodiments mutually exclusive, unless so stated or as will be readily apparent to those of ordinary skill in the art having the benefit of this disclosure. Thus, the present disclosure can include a variety of combinations and/or integrations of the embodiments and examples described herein, as well as further embodiments and examples as defined within the scope of all claims based on this disclosure, as well as all legal equivalents of such claims.

The present disclosure generally relates to memory devices for use within electronic devices, including computers, mobile telephones, music players, programmable electronic devices, or any combination thereof. In a particular example, the memory devices can be read-only memory (ROM) arrays that are formed from a plurality of transistor devices having terminals that are selectively coupled between bit-lines to represent data values and having control terminals coupled to word lines to allow data to be read from the ROM arrays. Such ROM arrays may be embodied in solid-state data storage devices, such as flash ROM devices.

In an aspect of the present disclosure, a memory array includes a plurality of memory cells. Each memory cell can include a transistor selectively configured to represent a data value based on its configuration of source and drain terminals relative to other transistors within the memory array and relative to adjacent bit-lines. In an embodiment, a zero value may be represented by a transistor having its source and drain terminals coupled to different bit-lines, and a one value may be represented by a transistor having its source and drain terminals coupled to a common bit-line or to source and drain terminals of adjacent memory cells.

In an embodiment, a memory array is disclosed that can include a plurality of word lines, a plurality of bit-lines, and a plurality of memory cells configured to represent data values. Each memory cell can include a transistor having a control terminal coupled to one of the plurality of word lines and having drain and source terminals. Connections associated with the drain and source terminals of a particular memory cell can determine a data value represented by the memory cell. The memory cells that are coupled to less than two bit-lines are configured to represent one values (i.e., digital "one" values).

Figure 1A:
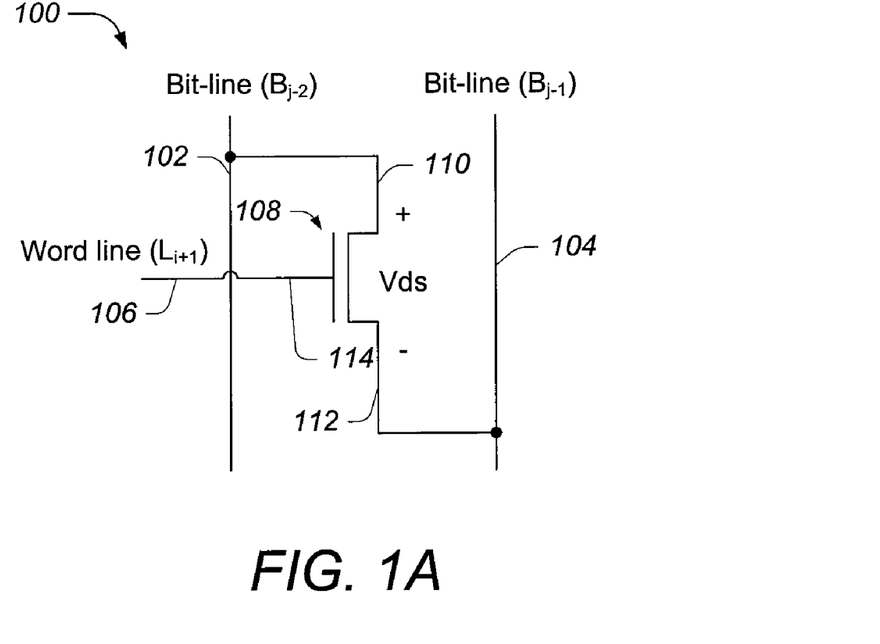
FIG. 1A depicts a schematic diagram of an example embodiment of a memory cell in a read-only memory (ROM) array configured to represent a zero value.
Figure 1B:
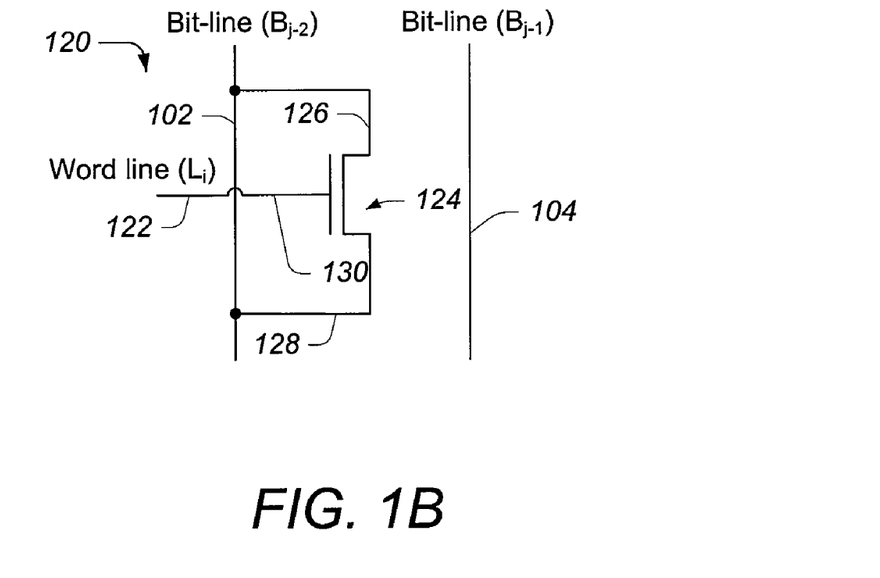
FIG. 1B depicts a schematic diagram of an example embodiment of a memory cell in the ROM array configured to represent a one value.
Figure 1C:
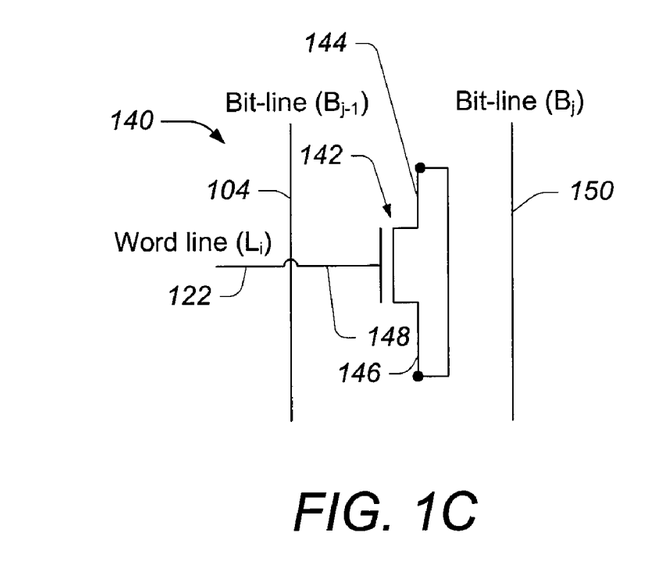
FIG. 1C depicts a schematic diagram of another example embodiment of a memory cell in the ROM array configured to represent a one value.
Figure 1D:
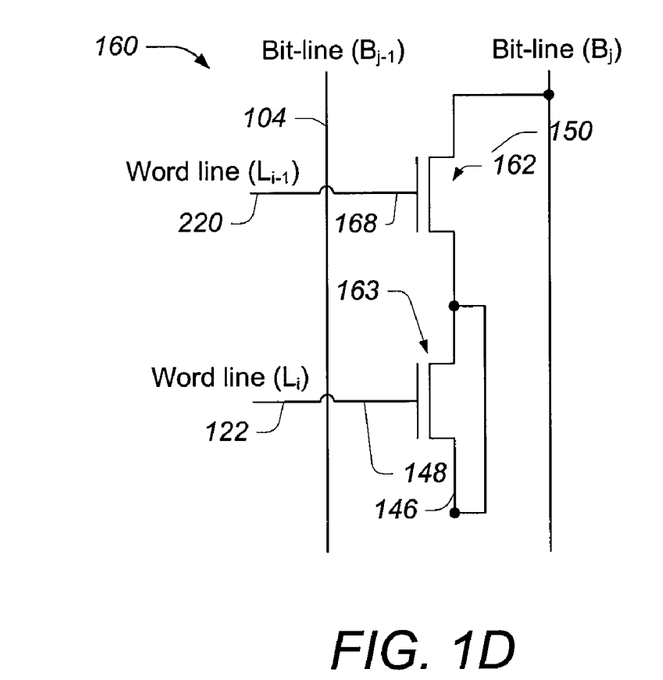
FIG. 1D depicts a schematic diagram of another example embodiment of a memory cell in the ROM array configured to represent a one value.
Figure 3:
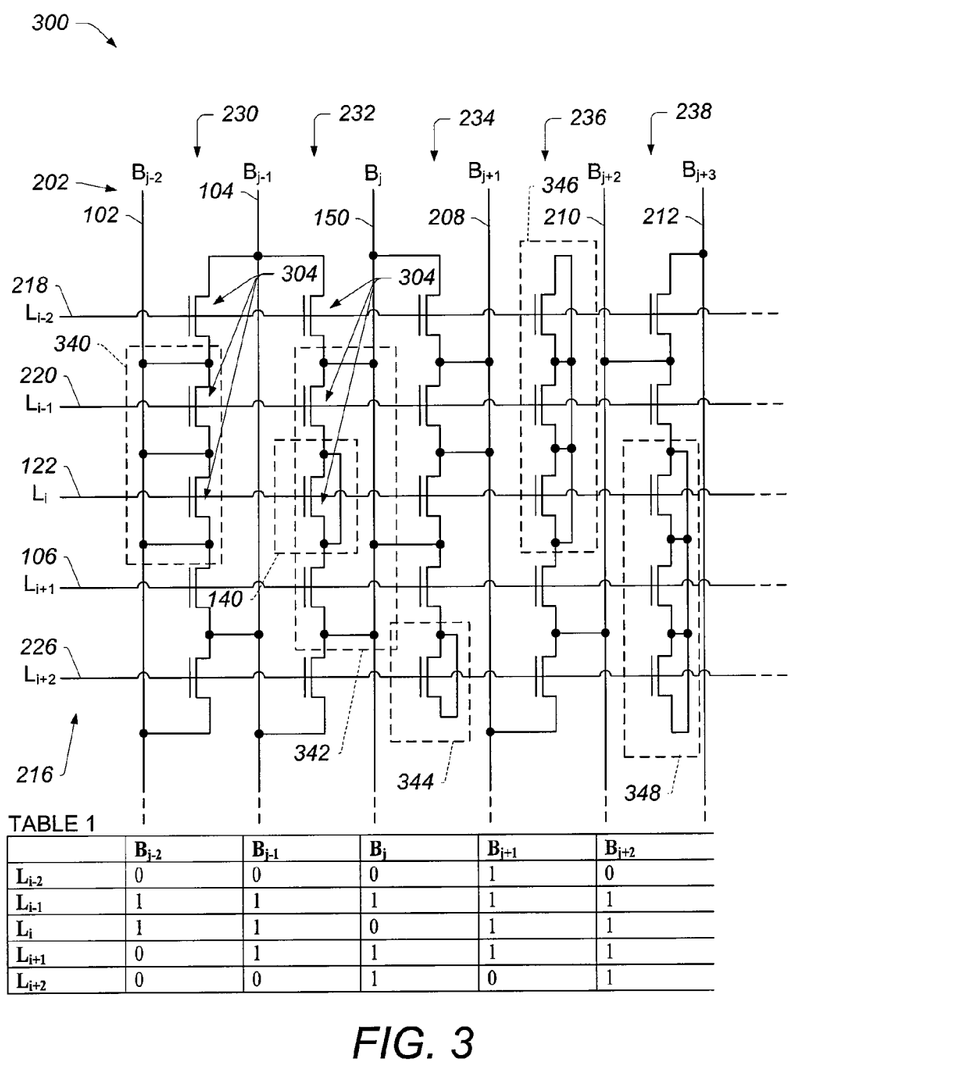
FIG. 3 depicts a schematic diagram of an example embodiment of a portion of a high-density non-volatile ROM array including memory cells configured according to the embodiments of FIGS. 1A-1D to provide the same data configuration as the ROM array of FIG. 2, but with fewer connections on the bit-lines.

In a particular example, at least some of the memory cells can be configured to represent one values by connecting their source and drain terminals together (as depicted in FIGS. 1B and 1C below) and, in some instances, by connecting them to source and drain terminals of adjacent memory cells without connecting them directly to a bit-line (as depicted in FIGS. 1D and 3 below).

FIG. 1A depicts a schematic diagram of a particular illustrative embodiment of a memory cell 100 configured to represent a zero value, for example, within a read-only memory (ROM) array. The ROM array may be used within any type of memory device, including a flash memory, for example. The memory cell 100 can include a transistor 108, such as a floating-gate metal oxide semiconductor field effect transistor (MOSFET), an insulated gate MOSFET, another metal oxide semiconductor (MOS) transistor device, or any combination thereof. The transistor 108 can be an n-channel (NMOS) transistor or a p-channel (PMOS) transistor. In the following discussion, the operation of the transistor 108 and of transistors within the memory array is described with respect to NMOS transistors; however, it should be understood that an NMOS transistor may be replaced with a PMOS transistor in some configurations and with appropriate modification to word line control signals to provide similar function and benefits.

The transistor 108 can include a drain terminal 110 coupled to a first bit-line ($B_{j-2}$) 102, a gate terminal 114 coupled to a word line ($I_{i+1}$) 106, and a source terminal 112 coupled to a second bit-line ($B_{j-1}$) 104. In this example, the subscripts (i and j) can refer to rows and columns within the memory array, such as the memory arrays depicted in FIGS. 2 and 3. In an example, the transistor 108 is configured to represent a zero value within the memory array.

In the embodiment shown, no reference line is used. Instead, the memory cells, such as the memory cell 100, can use the bit-lines 102 or 104 as reference lines. In an example, during a standby mode when no data is being read from the memory cell 100, the bit-lines 102 and 104 may be charged to a voltage level (Vdd), set to a ground voltage level, or left floating, such that all of the bit-lines 102 and 104 have an equivalent voltage potential. In this instance, the drain-source voltage (Vds) is approximately zero for each cell of the memory array, including the memory cell 100. Thus, there is no sub-threshold (sub-Vth) leakage current in the memory array during standby mode.

In an example, assuming each of the bit-lines 102 and 104 is initially charged to a first voltage level, a target bit-line, such as the bit-line 102, can be read by setting the adjacent bit-line 104 to a zero voltage level or potential. As used herein, the term "adjacent bit-line" refers to a bit-line that is shared by at least one memory cell of a column of memory cells that are associated with the target bit-line and does not necessarily refer to a proximity of the bit-line to any other bit-line. Also, as used herein, the term "adjacent memory cell" refers to a memory cell that is positioned proximate to or next within a particular column of a memory array, or to memory cells that can be logically understood to be next to one another within the column.

In this instance, setting the adjacent bit-line 104 to zero causes the drain-source voltage (Vds) across the transistor 108 to increase. When a voltage greater than or equal to a threshold voltage (Vth) is applied to the word line ($L_{i+1}$) 106, the transistor 108 is activated, causing a discharge onto the adjacent bit-line 104 via the transistor 108, reducing a voltage on the target bit-line 102, which change in voltage level may be sensed using sense circuitry coupled to the plurality of bit-lines 102 and 104. In another example, current may flow from the target bit-line 102 through the transistor 108 to the adjacent bit-line 104, which current may be sensed by sense circuitry to determine a value represented by the transistor 108. In either example, the discharge can indicate a zero value stored at the memory cell 100.

FIG. 1B depicts a schematic diagram of a particular illustrative embodiment of a memory cell 120 configured to represent a one value. The memory cell 120 can include a transistor 124 that is positioned between the bit-lines 102 and 104. In an example, the transistor 124 can include drain and source terminals 126 and 128, which can be coupled to the bit-line 102 and can include a gate terminal 130 that is coupled to a word line 122. In an example, the configuration of the transistor 124 can represent a one value.

In a particular example, assuming each of the bit-lines 102 and 104 is initially charged to a first voltage level, a target bit-line, such as the bit-line 102, can be read by setting the adjacent bit-line 104 to a zero voltage level. In this instance, setting the bit-line 104 to zero does not affect the drain-source voltage (Vds) of the transistor 124. Instead, when a voltage greater than or equal to the threshold voltage (Vth) is applied to the word line ($L_i$) 122, the transistor 124 is activated, but no discharge related to the transistor 124 can be seen at the bit-line ($B_{j-1}$) 104. For example, setting the bit-line 104 to a ground or zero voltage potential and activating the transistor 124 cannot result in a full discharge related to the transistor 124, since the transistor 124 is not coupled to the bit-line 104. Further, since the source and drain terminals 126 and 128 are tied to the same voltage potential, even if the transistor 124 is turned on, only a small amount of current can flow through the transistor 124. Accordingly, a value associated with the memory cell 120 can represent a one value, which can be sensed using sense circuitry coupled to the bit-lines 102 and 104.

FIG. 1C depicts a schematic diagram of a particular illustrative embodiment of a memory cell 140 configured to represent a one value. In this example, the memory cell 140 can include a transistor 142 that is positioned between bit-lines ($B_{j-1}$) and ($B_j$), 104 and 150, respectively. The transistor 142 can include drain and source terminals 144 and 146, which are coupled to each other. Further, the transistor 142 can include a gate terminal 148, which is coupled to the word line ($L_i$) 122.

In this particular example, assuming each of the bit-lines 104 and 150 is initially charged to a first voltage potential, a target bit-line, such as the bit-line 104, can be read by setting the adjacent bit-line 150 to a zero voltage potential. In this instance, setting the bit-line 150 to zero has no effect on the drain-source voltage (Vds) across the transistor 142. Further, in this instance, when a voltage greater than or equal to the threshold voltage (Vth) is applied to the word line ($L_i$) 122, the transistor 142 is activated, but no discharge related to the transistor 142 can be seen at the bit-line ($B_j$) 150. Additionally, since the drain and source terminals 144 and 146 are coupled to each other (i.e., to the same voltage potential) and not to either bit-line 104 or 150, even if the transistor 142 is turned on, no current flows through the transistor 142. Accordingly, a value associated with the memory cell 140 can represent a one value, which can be sensed using sense circuitry coupled to the bit-lines 104 and 150.

FIG. 1D depicts a schematic diagram of a particular illustrative embodiment of a memory cell 160 configured to represent a one value. In this example, the memory cell 160 can include a transistor 162 that is positioned between bit-lines ($B_j$) and ($B_{j-1}$), 150 and 104, respectively. The transistor 162 can include drain terminal coupled to bit-line 150 and source terminal coupled to the drain of adjacent memory cell 163. Further, the transistor 162 can include a gate terminal 168, which is coupled to the word line ($L_{i-1}$) 220.

In this particular example, assuming each of the bit-lines 104 and 150 is initially charged to a first voltage potential, a target bit-line, such as the bit-line 104, can be read by setting the adjacent bit-line 150 to a zero voltage potential. In this instance, setting the bit-line 150 to zero has no effect on the drain-source voltage (Vds) across the transistor 162. Further, in this instance, when a voltage greater than or equal to the threshold voltage (Vth) is applied to the word line ($L_{i-1}$) 220, the transistor 162 is activated, but no discharge related to the transistor 162 can be seen at the bit-line ($B_j$) 104 since it is not connected to the memory cell 160. Accordingly, a value associated with the memory cell 160 can represent a one value, which can be sensed using sense circuitry coupled to the bit-lines 104 and 150.

It should be understood that the memory cells 100, 120, 140 and 160 depicted in FIGS. 1A-1D are representative examples, and that other configurations to represent zeros and ones within a ROM array may be apparent to one skilled in the art in view of this disclosure. In a particular example, the drain and source terminals 110 and 112 of the transistor 108 may be coupled to the bit-lines 104 and 102, respectively, while the transistor 124 may have its source and drain terminals 126 and 128 coupled to the bit-line 104. Further, in an alternative embodiment, the one values may be represented by the configuration of the memory cell 100 depicted in FIG. 1A, and the zero values may be represented by the configuration of the memory cells 120, 140 and 160 depicted in FIGS. 1B, 1C and 1D. In this instance, rules for configuring the particular connections within a memory array (as discussed below in detail with respect to FIGS. 3-5) may be adjusted appropriately. Additionally, it should be understood that memory cells, such as the cells 100, 120, 140, and 160 depicted in FIGS. 1A-1D, may be incorporated within a ROM array, and that multiple memory cells may be accessed at the same time by activating one or multiple word lines depending on the architecture and by appropriately biasing selected bit-lines.

One particular advantage provided by a ROM array having data values represented by the configuration of the transistors that make up the array is that speed of reading the data out of the ROM array can be enhanced, thanks to the reduced number of connections of bit-lines. Also, dynamic power consumption is reduced, thanks to switching capacitance reduction. Additionally, during standby modes, which can represent a significant portion of the usable life of the memory array, since the bit-lines can have the same voltage potential, current leakage through the transistors is reduced.

In the following discussion, reference numbers from FIGS. 1A-1D are reused to place the memory cells 100, 120, 140, and 160 into context within examples of memory arrays. Further, in the following discussion, bit-line and word line numbers are reused for ease of discussion.

Figure 2:
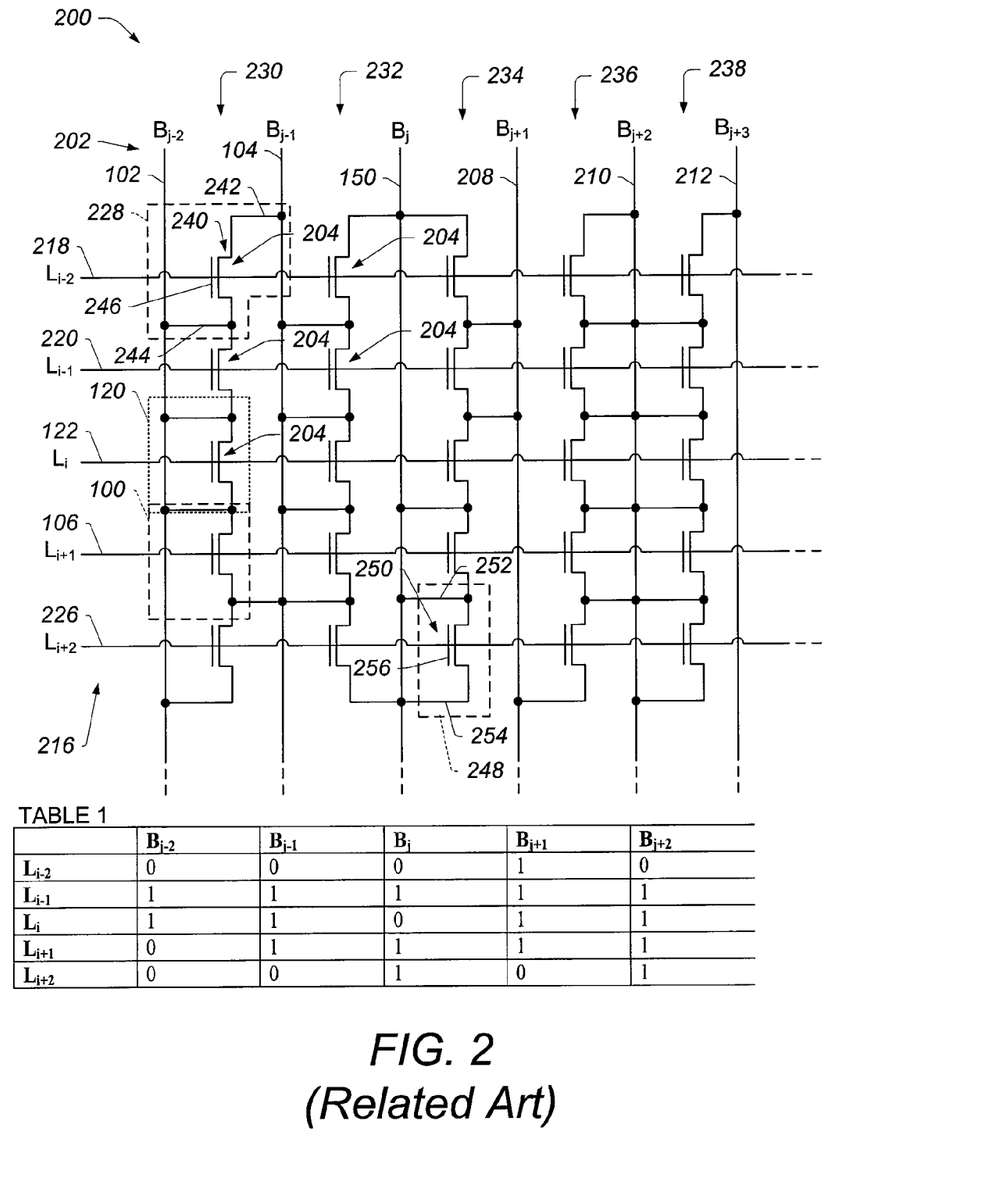
FIG. 2 depicts a schematic diagram of an example embodiment of a portion of a high-density non-volatile ROM array including memory cells configured according to the embodiments of FIGS. 1A and 1B to represent zero and one values.

FIG. 2 depicts a schematic diagram of a portion 200 of a high-density non-volatile ROM array including memory cells configured according to the embodiments of FIGS. 1A and 1B to represent zeros and ones. The portion 200 can include multiple bit-lines 202 and word lines 216 configured to connect various memory cells 204 within the memory array. The memory cells 204 can be organized into rows and columns. In the example shown, the word lines 216 can represent the rows, which are horizontally arranged. The word lines 216 include first, second, third, fourth, and fifth word lines ($L_{i-2}$, $L_{i-1}$, $L_i$, $L_{i+1}$, and $L_{i+2}$) 218, 220, 122, 106, and 226, respectively. Further, the bit-lines 202 can be vertically arranged, and can include first, second, third, fourth, fifth, and sixth bit-lines ($B_{h-2}$, $B_{j-1}$, $B_j$, $B_{j+1}$, $B_{j+2}$, and $B_{j+3}$) 102, 104, 150, 208, 210, and 212.

In the embodiment shown, the portion 200 can include columns of memory cells 204, including first, second, third, fourth, and fifth columns 230, 232, 234, 236 and 238. The bit-lines 202 are vertically arranged, defining the columns 230, 232, 234, 236, and 238, and each bit-line 202 is coupled to one or more source and/or drain terminals on either side of the respective bit-line. Further, each word line 218, 220, 122, 106, and 226 is coupled to gate terminals of transistors within a particular row. As used herein, the terms "row" and "column" are used to designate an arrangement of transistors in an approximate grid, with the connection lines (word lines 216 and bit-lines 202) approximately parallel to the rows and columns, respectively. Further, as used herein, the terms "horizontal" or "horizontally" and "vertical" or "vertically" are relative terms that refer to an arrangement of memory cells relative to one another within the respective figure, and not necessarily in terms of three-dimensional space. Further, the terms "horizontal" and "vertical" or "horizontally" and "vertically" are not used to represent absolute directions. It should be understood that the arrangement of transistors or memory cells 204 may be provided in different appropriate orientations.

In the embodiment of FIG. 2, there is one extra bit-line ($B_{j+3}$) 212, which can be used to bias memory cells within the column 238 to read from the memory cells via the target bit-line ($B_{j+2}$) 210. In other embodiments, the extra bit-line 212 may be in a different location, such as on the left side of FIG. 2, and it can be used to read from different memory cells.

In the embodiment shown, programming of each memory cell 204 is dependent on a last adjacent programmed cell in the same column. For example, programming of the memory cell 100 associated with the word line 106 depends on the data value represented by the memory cell 204 associated with the word line 226 in column 230. Similarly, the programming of the memory cell 120 can depend on the data value represented by the memory cell 100, in this example.

In this embodiment, each memory cell 204 is coupled by its source and drain terminals to one or two different bit-lines 202 and by its gate terminal to one word line 216. The memory cell 228 can include a transistor 240 having a drain terminal 242 coupled to the bit-line ($B_{j-1}$) 104, a source terminal 244 coupled to the bit-line ($B_{j-2}$) 102, and a gate terminal 246 coupled to the word line ($L_{i-2}$) 218. In this example, the memory cells 228 and 100 represent zero values.

Additionally, the memory cell 248 can include a transistor 250 having drain and source terminals 252 and 254 coupled to the bit-line ($B_j$) 150 (i.e., a common bit-line) and having a gate terminal 256 coupled to the word line ($L_{i+2}$) 226. In this example, the memory cells 248 and 120 can represent "one" values.

In the portion 200 of the ROM array depicted in FIG. 2, the data values represented by the memory cells 204 are provided below in Table 1.

TABLE 1

Data values in the ROM arrays depicted in FIGS. 2 and 3.

|  | $B_{j-2}$ | $B_{j-1}$ | $B_j$ | $B_{j+1}$ | $B_{j+2}$ |
|---|---|---|---|---|---|
| $L_{i-2}$ | 0 | 0 | 0 | 1 | 0 |
| $L_{i-1}$ | 1 | 1 | 1 | 1 | 1 |
| $L_i$ | 1 | 1 | 0 | 1 | 1 |
| $L_{i+1}$ | 0 | 1 | 1 | 1 | 1 |
| $L_{i+2}$ | 0 | 0 | 1 | 0 | 1 |

With reference again to the memory array of FIG. 2, the first bit-line ($B_{j-2}$) 102 has four connections, the second bit-line ($B_{j-1}$) 104 has six connections, the third bit-line ($B_j$) has six connections, the fourth bit-line ($B_{j+1}$) has three connections, and the fifth bit-line ($B_{j+2}$) has ten connections (five associated with memory cells 204 of the fourth column 236 and five associated with memory cells 204 of the fifth column 238). Each connection can add internal impedance and can provide a path for current leakage. Further, each connection contributes to the overall inter-connect, drain capacitances of bit-line and layout and routing complexities of the circuit.

Utilizing the memory cell configurations 100, 120, 140 and 160 depicted in FIGS. 1A-1D, the embodiment of FIG. 3 discussed immediately below can represent the same data values as the portion 200 of the memory array depicted in FIG. 2 and represented in Table 1, but with fewer connections to the bit-lines. Accordingly, overall power consumption due to leakage current and internal impedance is reduced. Further, the layout and routing can be simplified.

FIG. 3 depicts a schematic diagram of a portion 300 of a high-density non-volatile ROM array including memory cells 304 configured to provide the same data configuration as the ROM array of FIG. 2, but with fewer connections on the plurality of bit-lines 202 including the bit-lines 102, 104, 150, 208, 210, and 212. In this embodiment, the memory cells 304 can be configured as described with respect to the following examples.

In a first example, a memory cell 304 can be programmed to represent a zero value by coupling the source and drain terminals of the memory cell to different bit-lines, as depicted by the memory cell 100 in FIG. 1A. Further, one values can be programmed by connecting the source and drain terminals to a common bit-line, such as with the memory cells 340 in column 230. In this example, since the "one" values are programmed between two zero values but are fewer than three consecutive one values, the drain and source terminals are coupled to the same bit-line 102.

In an example represented by column 232, when more than two consecutive one values are to be programmed between two zero values, from the bottom to the top of the column 232, all of the memory cells 304 from the second memory cell to the memory cell before the last memory cell to be programmed to a one value are coupled with their source and drain terminals in common, as generally indicated at 342. In this example, the memory cell 140 represents both the second memory cell and the memory cell before the last memory cell to be programmed to a one value. Accordingly, the memory cell 140 has its source and drain terminals in common, which terminals are coupled to a source terminal of a last memory cell and to a drain terminal of a first memory cell to be programmed to a one value.

In an example represented by columns 234 and 238, again referring to programming the values from the bottom to the top of the columns, if one values are to be programmed before a zero value (and not between two zero values), all of the one-value memory cells from the first memory cell to the memory cell before the last memory cell are coupled with their source and drain terminals in common, as generally indicated at 344 and 348. In the example of 344, the first memory cell is also the memory cell before the last memory cell to be programmed as a one value. In contrast, the example of 348 shows three memory cells (three transistors) representing the first memory cell and the memory cell before the last memory cell to be programmed to a one value.

In the example represented by columns 234 and 236, by construction, the last cell programmed to represent a one value in the column 234 and the first cell programmed to represent a one value in the column 236 are configured like the example shown in FIG. 1D.

In yet another example represented by the column 236, if one values are programmed after a zero value (but not between two zero values), all of the memory cells from the second memory cell to the last memory cell have their source and drain terminals in common, as generally indicated at 346. In this particular example, the memory cells indicated at 346 are not coupled to either bit-line 208 or bit-line 210. Further, in an example (not shown), if one values are to be programmed in all of the memory cells of a given column and not before, after or between zero values, the drain and source terminals of each of the cells to be programmed may be connected in common and not connected to any bit-line.

In the examples depicted in FIG. 3, the data of Table 1 above can be represented by the memory array using fewer connections to the bit-lines 102, 104, 150, 208, 210, and 212 than the configuration represented in FIG. 2. In particular, the first bit-line ($B_{j-2}$) 102 has four connections, the second bit-line ($B_{j-1}$) 104 has three connections, the third bit-line ($B_j$) has four connections, the fourth bit-line ($B_{j+1}$) has three connections, and the fifth bit-line ($B_{j+2}$) has two connections. Table 2 below summarizes the connections of FIG. 2 versus FIG. 3 for each bit-line.

TABLE 2

Connections per bit-line in FIGS. 2 and 3.

|  | Bit-lines | | | | |
|---|---|---|---|---|---|
|  | Bj − 2 | Bj − 1 | Bj | Bj + 1 | Bj + 2 |
| # of connections in FIG. 2 | 4 | 6 | 6 | 3 | 10 |
| # of connections in FIG. 3 | 4 | 3 | 4 | 3 | 2 |

As represented in Table 2, thirteen bit-line connections may be saved using the connection layout technique described herein with respect to FIG. 3. In particular, three, two, and eight bit-line connections are eliminated for the second, third and fifth bit-lines 104, 150, and 212, respectively.

By reducing the number of bit-line connections, the speed of reading the data out of the ROM array can be enhanced. Also, the dynamic power can be reduced, since the drain/source capacitances are reduced and the associated noise is removed from the system (enhancing read margins). Additionally, since reference lines can be omitted, the density of the ROM array can be improved, because the routing of the reference lines can be avoided. Further, some interconnections to couple the source and drain terminals of adjacent memory cells to bit-lines can be omitted, thereby simplifying routing layout for the circuit. Additionally, during standby modes, which can represent a significant portion of the usable life of the memory array, since the bit-lines can have the same voltage potential, current leakage through the transistors is reduced. Moreover, since at least some of the memory cells may be interconnected without connecting to a bit-line, leakage via such memory cells can be eliminated, thereby reducing static power consumption.

Figure 4:
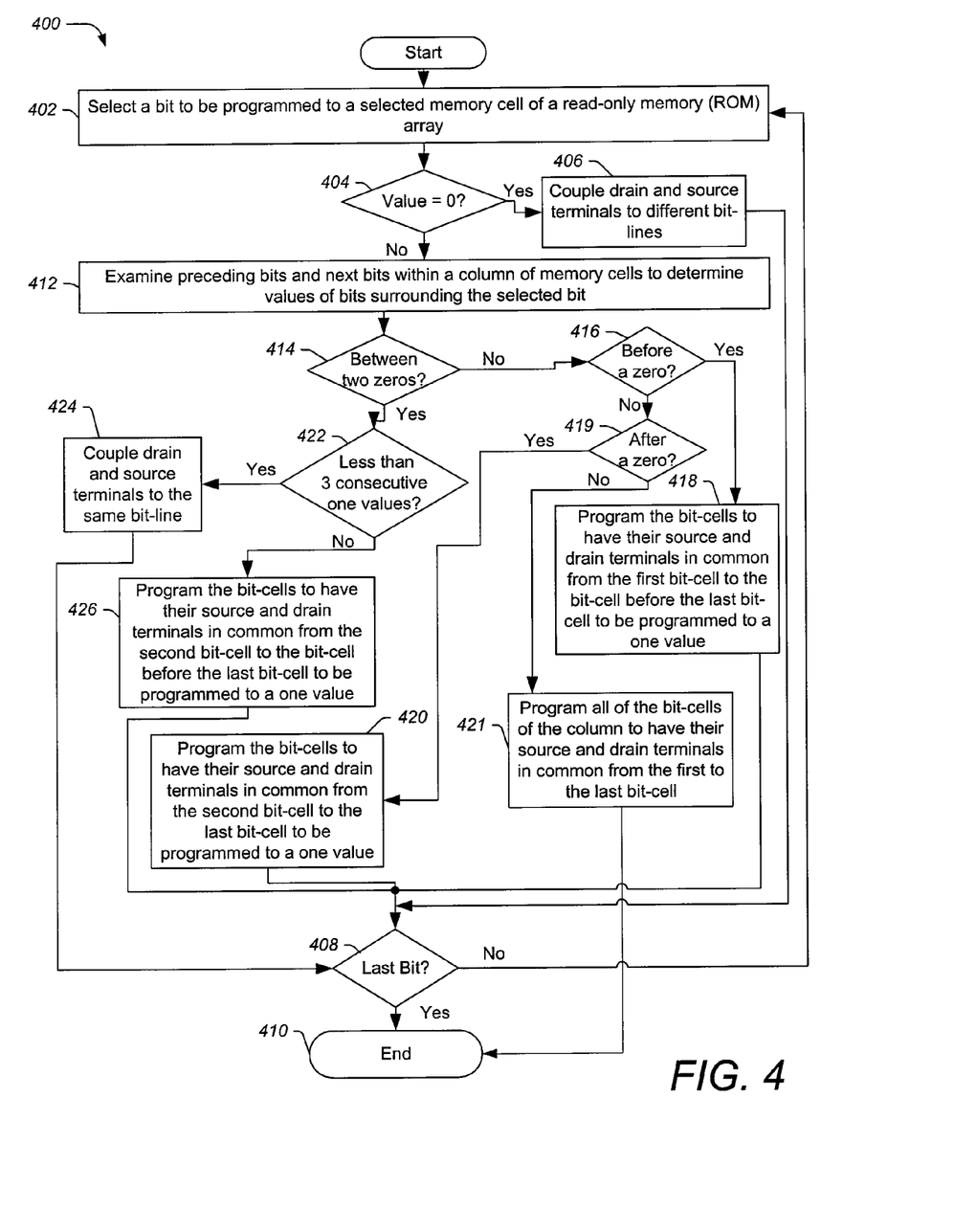
FIG. 4 depicts a flow diagram of an example embodiment of a method of programming a ROM array using the memory cell configurations of FIGS. 1A and 1D.

FIG. 4 depicts a flow diagram 400 of a particular example of a method of programming a ROM array using the memory cell configurations of FIGS. 1A-1D. At 402, a selected bit to be programmed to a selected memory cell of a read-only memory (ROM) array is determined. Advancing to 404, if the value of the selected bit is zero, the method proceeds to 406, and the drain and source terminals of the bit-cell (memory cell) can be coupled to different bit-lines. Continuing to 408, if the selected bit is the last bit, the method advances to 410, and the method is terminated. Otherwise, the method returns to 402, and another bit is selected.

Returning to 404, if the value of the selected bit is not zero, then the method advances to 412, and preceding and next bits to be stored within a column of memory cells can be examined to determine values of bits surrounding the selected bit. In an example, all of the bits to be programmed within a column of the memory array may be examined. At 414, if the selected bit is not between two zero values bits, the method advances to 416. At 416, if the selected bit is being programmed before a zero value, the method proceeds to 418, and bit-cells (memory cells) can be programmed to have their source and drain terminals in common from the first bit-cell to the bit-cell before the last bit-cell to be programmed to a one value. The method continues to 408, and if the selected bit is the last bit, the method terminates at 410. Otherwise, the method returns to 402.

Returning to 416, if the selected bit is not being programmed in front of (before) a zero value, the method advances to 419. At 419, if the selected bit is being programmed after a zero, the method advances to 420, and the bit-cells can be programmed to have their source and drain terminals in common from the second bit-cell to the last bit-cell to be programmed to a one value. The method moves to 408, and if the selected bit is the last bit, the method terminates at 410. Otherwise, the method returns to 402.

Returning to 419, if the selected bit is not being programmed after a zero, the method advances to 421, and all the bit-cells of the column can be programmed to have their source and drain in common from the first to the last bit-cell. The method terminates at 410.

Returning to 414, if the selected bit is being programmed between two zero values, the method advances to 422. At 422, if the selected bit is to be programmed in a sequence of bits that is less than three consecutive one values, the method proceeds to 424, and the drain and source terminals of each memory cell representing a one value can be coupled to the same bit-line. The method continues to 408, and if the selected bit is the last bit, the method terminates at 410. Otherwise, the method returns to 402.

Returning to 422, if the selected bit is to be programmed in a sequence that is greater than two consecutive one values, the method advances to 426, and the bit-cells can be programmed to have their source and drain terminals in common from the second bit-cell to the bit-cell before the last bit-cell to be programmed to a one value. The method advances to 408, and if the selected bit is the last bit, the method terminates at 410. Otherwise, the method returns to 402.

In general, the embodiment depicted in FIG. 4 is provided for illustrative purposes only, and it is not intended to be limiting. In an alternative example, "one" values may be represented by memory cells having source and drain terminals coupled to different bit-lines. Further, in an alternative example, the various decision blocks may be replaced with appropriate decision blocks to connect source and drain terminals of memory cells representing zero values. Further, though the example of FIG. 4 refers to selected bits, in an embodiment, the selected bits can include an entire sequence of bits to be represented by a column within the ROM array. Further, the order of the decision blocks may be rearranged. For example, the method may test if the selected bits follow a zero value first, before testing whether the bits are between two zero values. It should be understood that the example of FIG. 4 represents only one possible, non-limiting example of a method of programming a ROM array, and that other configurations of the method flow may be understood by one of skill in the art based on the present disclosure.

Figure 5:
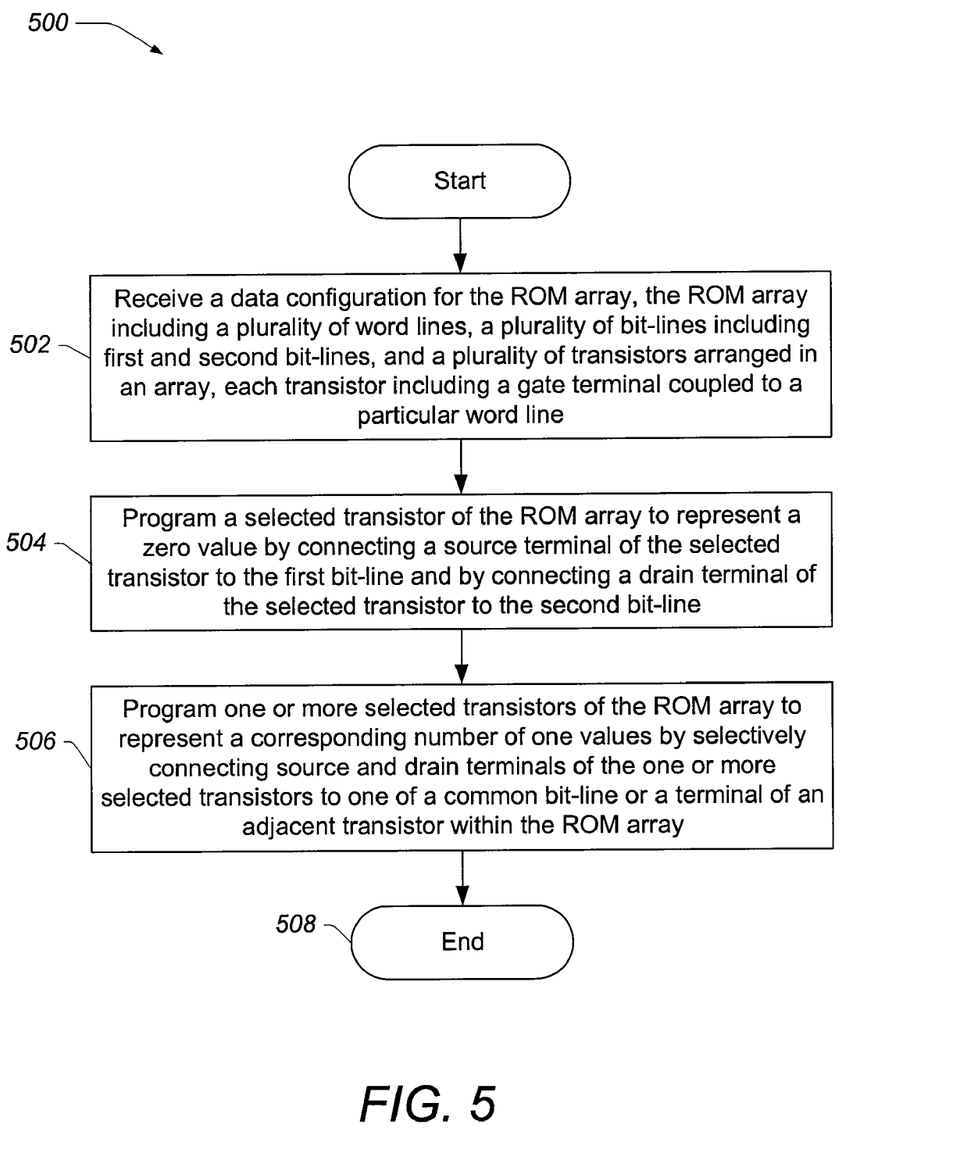
FIG. 5 depicts a flow diagram of another example embodiment of a method of programming a ROM array using the memory cell configurations of FIGS. 1A-1D.

FIG. 5 depicts a flow diagram 500 of a second example of a method of programming a ROM array according to the embodiments of the memory cells 100, 120, 140, and 150 depicted in FIGS. 1A-1D. At 502, a data configuration for the ROM array is received, where the ROM array can include a plurality of word lines, a plurality of bit-lines including first and second bit-lines, and a plurality of transistors arranged in an array, and where each transistor can include a gate terminal coupled to a particular word line.

Advancing to 504, a selected transistor of the ROM array is programmed to represent a zero value by connecting a source terminal of the selected transistor to the first bit-line and by connecting a drain terminal of the selected transistor to the second bit-line. Continuing to 506, one or more selected transistors of the ROM array can be programmed to represent a corresponding number of "one" values by selectively connecting source and drain terminals of the one or more selected transistors to one of a common bit-line or a terminal of an adjacent transistor within the ROM array.

As discussed above with respect to FIGS. 3 and 4, if less than three consecutive one values are to be programmed between two zero values, each of the one-value transistors has source and drain terminals coupled to the same bit-line. On the other hand, if more than three consecutive one values are to be programmed or if one values are programmed that are not between two zero values within a column of the ROM array, at least some of the sources and drains may be coupled together without being coupled to a bit-line, thereby reducing a number of connections associated with the bit-lines.

In a particular embodiment, programming the one or more selected transistors of the ROM array to represent the corresponding number of one values can include programming the one or more selected transistors to have their source and drain terminals coupled to a common bit-line, when two or fewer one values are to be programmed between two zero values. In another particular embodiment, programming the one or more selected transistors of the ROM array can include programming selected transistors of the one or more selected transistors to have their source and drain terminals coupled in common, when three or more one values are to be programmed between two zero values.

In still another particular embodiment, programming the one or more selected transistors of the ROM array can include programming selected transistors of the one or more selected transistors to have their source and drain terminals in common from a first transistor to a transistor before a last transistor to be programmed to a one value, when the selected transistors are programmed before a zero value but not between two zero values. In yet another particular embodiment, the one or more transistors can be programmed to one values by programming selected transistors of the one or more selected transistors to have their source and drain terminals in common from a second transistor to a last transistor to be programmed to a one value, when selected transistors are programmed after a zero value but not between two zero values. In another particular embodiment, the one or more transistors can be programmed to one value by programming selected transistors of the one or more selected transistors to have their sources and drains terminals in common from a first transistor to a last transistor, when selected transistors are not programmed after a zero neither before a zero and not between two zero values. The method terminates at 508.

Figure 6:
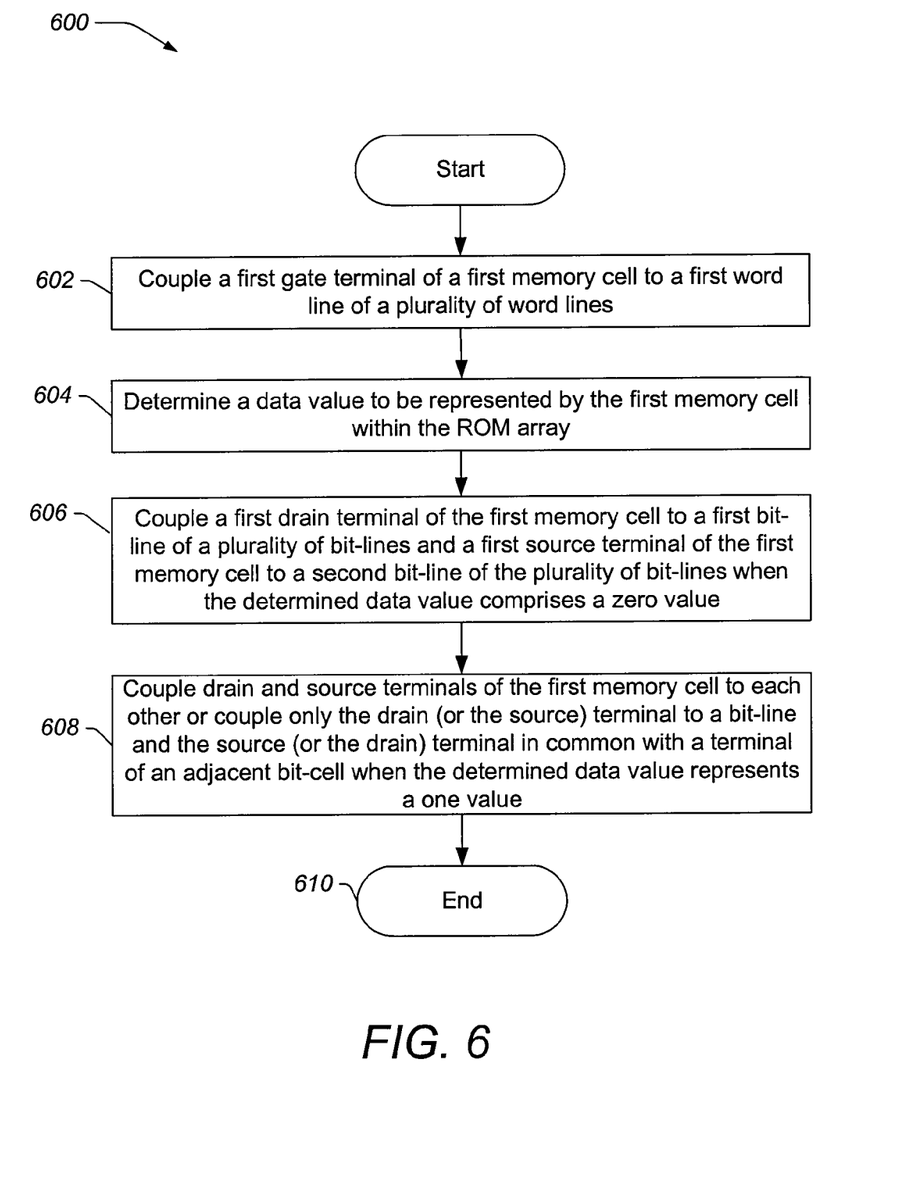
FIG. 6 depicts a flow diagram of still another example embodiment of a method of programming a ROM array using the memory cell configurations of FIGS. 1A-1D.

FIG. 6 depicts a flow diagram 600 of another example of a method of programming a read-only memory (ROM) array. At 602, a first gate terminal of a first memory cell is coupled to a first word line of a plurality of word lines. In an example, the ROM array includes a plurality of bit-lines, a plurality of word lines, and a plurality of transistors, where each transistor including a gate terminal, a drain terminal, and a source terminal. Advancing to 604, a data value to be represented by the first memory cell within the ROM array is determined.

Continuing to 606, a first drain terminal of the first memory cell is coupled to a first bit-line of a plurality of bit-lines and a first source terminal of the first memory cell is coupled to a second bit-line of the plurality of bit-lines when the determined data value comprises a zero value. Proceeding to 608, drain and source terminals of the first memory cell are coupled to each other or only the drain (or the source) is connected to a bit-line and the source (or the drain) is in common with adjacent bit-cell when the determined data value comprises a one value. The method terminates at 610.

It should be noted that the flow diagrams above are provided for illustrative purposes only, and are not intended to be limiting. Further, it should be noted that the individual activities shown in the flow diagrams do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

In an example, when the determined data value comprises a one value to be programmed between two memory cells representing zero values, the method further includes determining a number of consecutive "one" values to be programmed. Additionally, the method can include coupling the drain and source terminals together from a second memory cell to a memory cell before a last memory cell to be programmed to represent a one value when the determined number of consecutive one values is greater than two and coupling the drain and source terminals of the memory cell together through a common bit-line when the determined number of consecutive one values is not greater than two.

In another example, the source and drain terminals can be coupled together via a common wire trace that is not coupled to a bit-line, when the determined number of consecutive "one" values is greater than two. In another example, when the determined data value is a one value to be programmed before a memory cell representing a zero value, the method can include coupling the source and drain terminals together from a first memory cell to a memory cell before a last memory cell to be programmed to represent a one value.

In still another example, when the determined data value is to be programmed after a memory cell representing a zero value, the method can include coupling the source and drain terminals together from a second memory cell to a last memory cell to be programmed to represent a one value. In still another example, at least some memory cells can be configured to represent consecutive one values within the ROM array by connecting their source and drain terminals together and without connecting them to a bit-line.

In conjunction with the examples of the memory arrays and methods described above with respect to FIGS. 1A-6, a read-only memory array and a technique for configuring the transistor connections to represent particular data values are disclosed, which reduce the number of bit-line connections, simplify routing complexity, increase access speed, and reduce dynamic power consumption. In an example, a ROM array is disclosed, which can include transistors with their source and drain terminals coupled to different bit-lines to represent zero values and having their source and drain terminals coupled to less than two bit-lines to represent one values. In an example, the transistors can be configured to represent one values by connecting their source and drain terminals to a common bit-line, or by connecting the source and drain terminals in common without connecting them to a bit-line, or by connecting the source (or drain) terminal to terminals of an adjacent memory cell configured to represent a one value and drain (or source) terminal to a bit-line. In an example, transistors to be programmed to a one value may be coupled together by their source and/or drain terminals without connecting to a bit-line.

Many additional modifications and variations may be made in the techniques and structures described and illustrated herein without departing from the spirit and scope of the present disclosure. For example, the NMOS transistors can be replaced with PMOS transistors. Additionally, the transistor configurations can be reversed, such that one values are represented by connecting the source and drain terminals of a transistor to different bit-lines, and zero values are represented by connecting the source and drain terminals to the same bit-line or by connecting the source and/or drain terminals to terminals of an adjacent transistor. Further, while the above-examples have generally described the capability of reading a single target cell, it should be understood that, in some instances, multiple target cells may be read at one time. Accordingly, the present disclosure should be clearly understood to be limited only by the scope of the claims and the equivalents thereof.

We claim:

1. A memory array comprising:
a plurality of word lines;
a plurality of bit-lines; and
a plurality of memory cells configured to represent data values, each memory cell comprising a transistor having a control terminal coupled to one of the plurality of word lines, a drain terminal, and a source terminal,
wherein connections associated with the drain and source terminals of a particular memory cell determine a data value stored within the memory cell,
and wherein memory cells of the plurality of memory cells that are coupled to less than two bit-lines are configured to represent one values such that a first memory cell in the plurality of memory cells including a first drain terminal coupled to a first bit-line and a first source terminal coupled to the first bit-line represents a one value, and
a second memory cell in the plurality of memory cells including a second drain terminal coupled to the first bit-line and a second source terminal coupled to a second bit-line represent a zero value.

2. The memory array of claim 1, wherein at least one of the plurality of memory cells is coupled to a respective word line of the plurality of word lines and is interconnected to another memory cell without connecting to a bit-line of the plurality of bit-lines to represent a one value.

3. The memory array of claim 2, wherein the plurality of word lines comprises first, second, third, fourth, and fifth word lines.

4. The memory array of claim 3, wherein the plurality of memory cells comprises:
    a first transistor device including a first gate terminal coupled to the first word line, a first drain terminal, and a first source terminal coupled to the first drain terminal to represent a one value;
    a second transistor device including a second gate terminal coupled to the second word line and including second drain and source terminals coupled to the first drain terminal to represent a second one value;
    a third transistor device including a third gate terminal coupled to the third word line and including a third drain terminal coupled to the first drain terminal, and a third source terminal coupled to a first bit-line of the plurality of bit-lines to represent a third one value;
    a fourth transistor device including a fourth gate terminal coupled to the fourth word line, a fourth drain terminal coupled to the third drain terminal, and a fourth source terminal coupled to a second bit-line of the plurality of bit-lines to represent a zero value; and
    a fifth transistor device including a fifth gate terminal coupled to the fifth word line and including fifth drain and source terminals coupled to the fourth source terminal to represent a one value.

5. The memory array of claim 1, wherein the plurality of memory cells provide a read only memory (ROM) array.

6. The memory array of claim 1, wherein a memory cell is configured to represent a zero value within a column of the memory array, and wherein the plurality of memory cells after and before the zero value memory cell have their source and drain terminals coupled together or coupled to at least one bit-line.

7. A method of programming a read-only memory (ROM) array, the ROM array including a plurality of bit-lines, a plurality of word lines, and a plurality of transistors, each transistor including a gate terminal, a drain terminal, and a source terminal, the method comprising:
    coupling a first gate terminal of a first memory cell to a first word line of the plurality of word lines;
    determining a data value to be represented by the first memory cell; coupling a first drain terminal of the first memory cell to a first bit-line of the
    plurality of bit-lines and a first source terminal of the first memory cell to a second bit-line of the plurality of bit-lines when the determined data value comprises a zero value;
    coupling drain and source terminals of the first memory cell to each other when the determined data value and the next determined data value represent one values; and
    coupling one of the drain terminal and the source terminal of the first memory cell to one of the first and second bit-lines when the determined data value is one and the next data value is zero.

8. The method of claim 7, wherein when the determined data value comprises a one value to be programmed between two memory cells representing zero values, the method further comprising:

determining a number of consecutive one values to be programmed; coupling the drain and source terminals together from a second memory cell
    to a memory cell before a last memory cell to be programmed to represent a one value when the determined number of consecutive one values is greater than two; and
coupling the drain and source terminals of the second memory cell together through a common bit-line when the determined number of consecutive one values is not greater than two.

9. The method of claim 8, wherein the source and drain terminals of the second memory cell are coupled together via a common wire trace that is not coupled to a bit-line, when the determined number of consecutive one values is greater than two.

10. The method of claim 7, further comprising coupling the source and drain terminals together from the first memory cell to a memory cell before a last memory cell to be programmed to represent a one value when the determined data value is to be programmed before a memory cell representing a zero value.

11. The method of claim 7, further comprising coupling the source and drain terminals together from a second memory cell to a last memory cell to be programmed to represent a one value when the determined data value is to be programmed after a memory cell representing a zero value.

12. The method of claim 7, wherein at least some memory cells of the plurality of memory cells are configured to represent consecutive one values within the ROM array, the at least some memory cells having source and drain terminals coupled together and not coupled to a bit-line of the plurality of bit-lines.

13. The method of claim 7, wherein at least some of the plurality of memory cells are not directly coupled to a bit-line of the plurality of bit-lines.

14. A memory array comprising:
    a plurality of word lines including first, second, third, fourth, and fifth word lines;
    a plurality of bit-lines including first and second bit-lines;
    a plurality of memory cells configured to represent data values, the plurality of memory cells comprising:
    a first transistor device including a first gate terminal coupled to the first word line, a first drain terminal, and a first source terminal coupled to the first drain terminal to represent a first one value;
    a second transistor device including a second gate terminal coupled to the second word line and including second drain and source terminals coupled to the first drain terminal to represent a second one value;
    a third transistor device including a third gate terminal coupled to the third word line and including a third drain terminal coupled to the first drain terminal, and a third source terminal coupled to a second bit-line of the plurality of bit-lines to represent a third one value;
    a fourth transistor device including a fourth gate terminal coupled to the fourth word line, a fourth drain terminal coupled to the third drain terminal, and a fourth source terminal coupled to a first bit-line of the plurality of bit-lines to represent a zero value; and
    a fifth transistor device including a fifth gate terminal coupled to the fifth word line and including fifth drain and source terminals coupled to the fourth source terminal to represent a fourth one value.

15. The memory array of claim 14, wherein the plurality of memory cells comprise a read only memory (ROM) array.

16. The memory array of claim 14, further comprising a sixth transistor comprising:
- a sixth gate terminal coupled to the first word line;
- a sixth drain terminal coupled to a third bit-line; and
- a sixth source terminal coupled to the second bit-line;
- wherein the sixth transistor is configured to represent a zero value.

17. The memory array of claim 16, further comprising a seventh transistor comprising:
- a seventh gate terminal coupled to the second word line;
- a seventh drain terminal coupled to the sixth source terminal; and
- a seventh source terminal coupled to an eighth drain terminal of an eighth transistor;
- wherein the seventh transistor is configured to represent a one value.

18. The memory array of claim 17, further comprising the eighth transistor comprising:
- an eighth gate terminal coupled to the third word line;
- the eighth drain terminal coupled to the seventh source terminal; and
- an eighth source terminal coupled to the seventh source terminal,
- wherein the eighth transistor is configured to represent a one value.

19. The memory array of claim 14, wherein the plurality of word lines comprises a number of word lines corresponding to a number of rows of the memory array, and wherein the plurality of bit-lines comprises a number of bit-lines corresponding to one more bit-line than a number of columns of the memory array.

* * * * *

UNITED STATES PATENT AND TRADEMARK OFFICE
CERTIFICATE OF CORRECTION

PATENT NO. : 8,134,870 B2
APPLICATION NO. : 12/485749
DATED : March 13, 2012
INVENTOR(S) : Salwa Bouzekri Alami Page 1 of 1

It is certified that error appears in the above-identified patent and that said Letters Patent is hereby corrected as shown below:

Column 3, line 45, please delete "$(I_{i+1})$" and insert therefor -- $(L_{i+1})$ --;

Column 6, line 18, please delete "$(B_{h-2},$" and insert therefor -- $(B_{j-2},$ --;

Column 8, line 50, please delete "Bj – 2  Bj – 1  Bj  Bj + 1  Bj + 2" and insert therefor -- $B_{j-2}$  $B_{j-1}$  $B_j$  $B_{j+1}$  $B_{j+2}$ --;

Column 13, line 36 (Claim 5), please delete "read only" and insert therefor -- read-only --; and Column 15, line 2 (Claim 15), please delete "read only" and insert therefor -- read-only --.

Signed and Sealed this
Eighth Day of May, 2012

David J. Kappos
*Director of the United States Patent and Trademark Office*